(12) United States Patent
Schenzinger et al.

(10) Patent No.: US 9,923,573 B2
(45) Date of Patent: Mar. 20, 2018

(54) METHOD AND DEVICE FOR READING A SERIAL DATA STREAM

(71) Applicant: DR. JOHANNES HEIDENHAIN GmbH, Traunreut (DE)

(72) Inventors: Daniel Schenzinger, Palling-Freutsmoos (DE); Stephan Kreuzer, Surberg-Ettendorf (DE)

(73) Assignee: DR. JOHANNES HEIDENHAIN GmbH, Traunreut (DE)

( * ) Notice: Subject to any disclaimer, the term of this patent is extended or adjusted under 35 U.S.C. 154(b) by 0 days.

(21) Appl. No.: 14/953,509

(22) Filed: Nov. 30, 2015

(65) Prior Publication Data
US 2016/0164535 A1 Jun. 9, 2016

(30) Foreign Application Priority Data

Dec. 8, 2014 (DE) .................... 10 2014 225 084

(51) Int. Cl.
*H04L 27/10* (2006.01)
*H03M 5/12* (2006.01)
*G06F 13/42* (2006.01)

(52) U.S. Cl.
CPC .......... *H03M 5/12* (2013.01); *G06F 13/4295* (2013.01)

(58) Field of Classification Search
CPC .............................. H03M 5/12; G06F 13/4295
USPC ................................. 375/282, 259, 271, 279
See application file for complete search history.

(56) References Cited

U.S. PATENT DOCUMENTS

| | | | |
|---|---|---|---|
| 5,162,791 A * | 11/1992 | Heegard | H03M 5/12 370/445 |
| 6,907,485 B2 | 6/2005 | White, III et al. | |
| 7,206,882 B2 | 4/2007 | White, III et al. | |
| 2011/0038428 A1* | 2/2011 | Fukuda | H03M 5/20 375/259 |
| 2011/0109484 A1* | 5/2011 | Sugita | H03M 5/145 341/55 |
| 2011/0116501 A1* | 5/2011 | Beaury | H04L 25/4904 370/389 |

(Continued)

FOREIGN PATENT DOCUMENTS

| | | |
|---|---|---|
| EP | 0187342 A2 | 7/1986 |
| EP | 0289237 A2 | 11/1988 |

(Continued)

OTHER PUBLICATIONS

"Kapitel 1.2" In: Bernd Schürmann: "Rechnerverbindungsstrukturen", Dec. 31, 1997 (Dec. 31, 1997), View, Braunschweig/Wiesbaden, XP002756101, ISBN: 3-528-05562-6, pp. 64-83.

*Primary Examiner* — Helene Tayong
(74) *Attorney, Agent, or Firm* — Leydig, Voit & Mayer, Ltd.

(57) ABSTRACT

A method for reading a serial data stream in a piece of automation technology equipment includes encoding the data stream to include at least two symbols which are distinguishable by a time interval between two successive signal edges. The data stream is delivered to a read unit including a symbol recognition unit which associates a time sequence of the signal edges with a respective one of the symbols taking into account a period of time including a current symbol duration of one of the symbols to be currently associated and at least one old symbol duration of a preceding one of the symbols.

15 Claims, 9 Drawing Sheets

(56) References Cited

U.S. PATENT DOCUMENTS

2013/0197920 A1* 8/2013 Lesso .................. H04L 25/4902
　　　　　　　　　　　　　　　　　　　　　　　704/500

FOREIGN PATENT DOCUMENTS

| JP | 2009267646 A | 11/2009 |
| WO | WO 03067804 A1 | 8/2003 |

* cited by examiner

METHOD AND DEVICE FOR READING A SERIAL DATA STREAM

CROSS-REFERENCE TO PRIOR APPLICATION

Priority is claimed to German Patent Application No. DE 10 2014 225 084.6, filed on Dec. 8, 2014, the entire disclosure of which is hereby incorporated by reference herein.

FIELD

The present invention relates to a method for reading a serial data stream, and a corresponding device.

The method according to an embodiment of the present invention and devices for carrying out this method are particularly suitable for use in automation technology equipment.

BACKGROUND

Typical examples of automation technology equipment are position-measuring devices and the subsequent electronics in conjunction with which they are used. The subsequent electronics may be, for example, numerical machine tool controls or complex plant control systems.

Position-measuring devices are used, for example, to determine, in closed-loop drive mechanisms, actual position values which are needed by subsequent electronics, such as a numerical control system, to calculate setpoints for control circuits used to control the drive mechanism (e.g., the feed rate of a tool or workpiece). If the position-measuring devices are in the form of rotary encoders or angle-measuring devices, then these are directly or indirectly coupled, for example, to the shaft of a motor for this purpose. Length-measuring devices measure, for example, linear movements between a machine bed and a machine part that is positionable relative to the machine bed, such as, for example, a movable tool carriage.

Today, absolute position-measuring devices are preferably used. Such devices generate absolute measurement values, which are transmitted from the position-measuring device to the subsequent electronics via digital, mostly serial data interfaces. The measurement values are mostly position values (angular values or linear positions), but there are also known position-measuring devices which deliver velocity or acceleration values; i.e., measurement values which indicate changes in positions over time.

Frequently, long distances must be spanned between measuring devices and their subsequent electronics for data transmission purposes, especially in the case of large plants or plants which are distributed over a large area. As a result, the signal quality of the digital signals deteriorates over the line length, making it more difficult at the receiver end to correctly read arriving data streams.

This can be counteracted by using high-quality data cables which, however, significantly increases the cost of the overall system.

Another way of achieving reliable data transmission in spite of long cable lengths is by reducing the data transfer rate. This, however, adversely affects the dynamic performance of control circuits which, for example, require position values from position-measuring devices as actual position values to be able to calculate new desired position values.

International Patent Application WO 03/067804 A1 proposes to determine a bit error rate at the receiver end, and to take actions as a function thereof, such as to request a repetition of the transmission or to reduce the length of data packets to be transmitted. These actions also have negative effects on the operation of dynamic control circuits.

SUMMARY

In an embodiment, the present invention provides a method for reading a serial data stream in a piece of automation technology equipment. The data stream is encoded to include at least two symbols which are distinguishable by a time interval between two successive signal edges. The data stream is delivered to a read unit including a symbol recognition unit which associates a time sequence of the signal edges with a respective one of the symbols taking into account a period of time including a current symbol duration of one of the symbols to be currently associated and at least one old symbol duration of a preceding one of the symbols.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

In an embodiment, the present invention provides a method for reading a serial data stream in a piece of automation technology equipment.

Provided in an embodiment is a method for reading a serial data stream in a piece of automation technology equipment, where the data stream is encoded to include at least two symbols which are distinguishable by the time interval between two successive signal edges, and the data stream is delivered to a read unit including a symbol recognition unit which associates the time sequence of signal edges with symbols, and where a period of time including a current symbol duration of the symbol to be currently associated and at least one old symbol duration of the preceding symbol is taken into account for the association of a symbol.

Provided in another embodiment is a device for reading a serial data stream in a piece of automation technology equipment, where the data stream is encoded to include at least two symbols which are distinguishable by the time interval between two successive signal edges, and the data stream is delivered to a read unit including a symbol recognition unit which associates the time sequence of signal edges with symbols, and where, in the symbol recognition unit, a symbol can be associated taking into account a period of time including a current symbol duration of the symbol to be currently associated and at least one old symbol duration of the preceding symbol.

Thus, the current symbol duration is determined by the time interval between the two signal edges that arrived last at the symbol recognition unit. The period of time taken into account for the association of a symbol with the current symbol duration further includes at least one additional preceding signal edge.

The symbol recognition unit includes an association unit which receives
- the current symbol duration and at least the old symbol duration, or
- a sum of the current symbol duration and at least the old symbol duration, or
- a sum of the current symbol duration and a deviation of at least the old symbol duration from an ideal duration, or
- a sum of the current symbol duration, the deviation of at least the old symbol duration from an ideal duration and an offset value.

In the association unit, the current symbol duration is associated with a symbol based on these values.

To generate the values that form the basis for the association of the symbol, the symbol recognition unit is provided with suitable means. In particular, these means may include at least one time measurement unit for measuring the duration between signal edges of the data stream to be read, an arithmetic unit for calculating the required sums, deviations, etc., as well as a measurement value memory for buffering measured symbol durations. The means may receive, from the association unit, information as to which symbol was associated with the old symbol duration.

Figure 1:
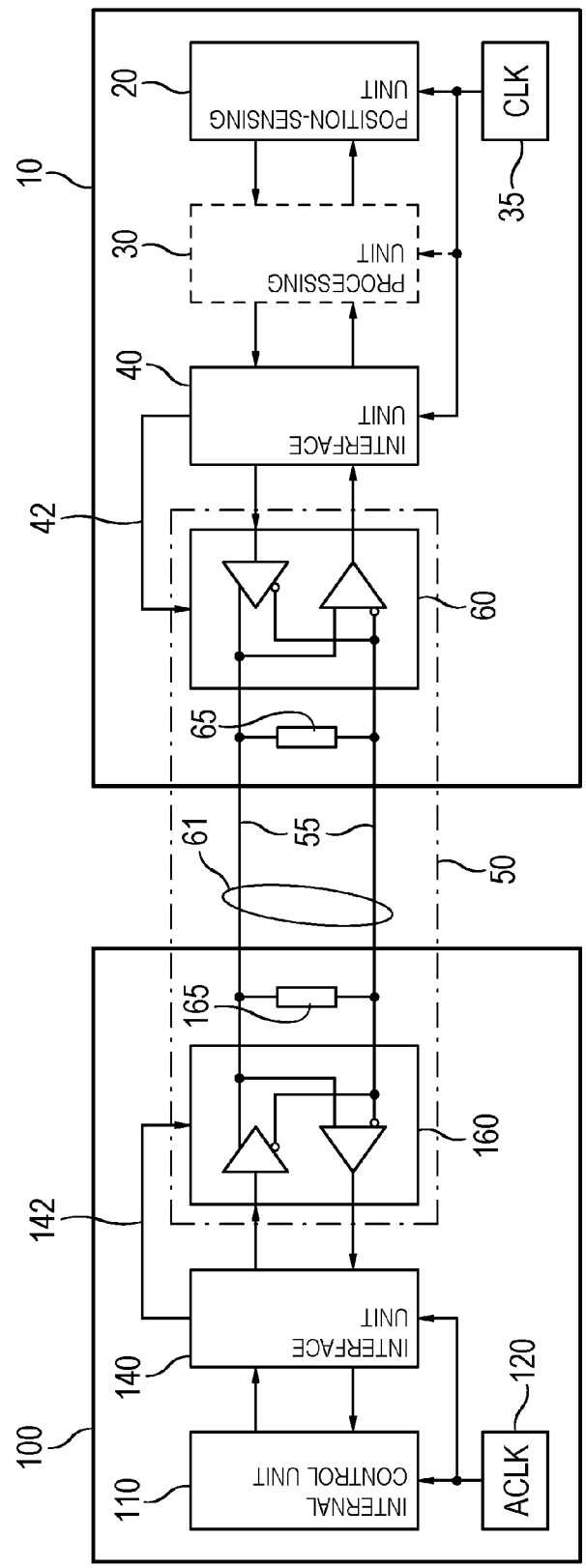
FIG. 1 is a block diagram of a position-measuring device and subsequent electronics which are interconnected via a bidirectional data channel.

FIG. 1 shows a block diagram of a position-measuring device 10 and subsequent electronics 100 which are interconnected via a data channel 50. In this context, position-measuring device 10 and subsequent electronics 100 are representative examples of automation technology equipment.

Position-measuring device 10 has measuring device components in the form of a position-sensing unit 20 and an optional processing unit 30. Position-sensing unit 20 is suitably adapted to generate digital position values. For this purpose, it may, for example, include a material measure having a measuring graduation, a scanning unit for scanning the measuring graduation, as well as signal-processing electronics for generating the digital position value from the scanning signals of the scanning unit, which are generated by scanning the measuring graduation. The material measure and the scanning unit are arranged, in known manner, to be movable relative to each other, and are mechanically connected to machine parts whose relative position is to be measured. If position-measuring device 10 is a rotary encoder for measuring the angular position of the shaft of an electric motor, then the scanning unit (or the housing of the rotary encoder) may be attached, for example, to a motor housing, and a shaft of the rotary encoder, which shaft is non-rotatably connected with the material measure, is connected to the motor shaft to be measured via a shaft coupling.

Also provided in position-measuring device 10 is a clock generator 35, in particular to provide a time base; i.e., a defined time pattern, for the digital circuit elements. The clock generator delivers at least one clock signal CLK which is fed to digital finite-state automatons, microprocessors, microcontrollers, etc.

The physical scanning principle underlying the position-sensing unit 20 is irrelevant to the present invention. It may, for example, be an optical, magnetic, capacitive or inductive scanning principle. Depending on the processing steps required to process the scanning signals of the scanning unit into position values, the signal-processing electronics includes functional units performing processing steps such as amplification, signal correction (offset correction, amplitude correction, phase correction), interpolation, counting grating periods, and A/D conversion, . . . .

Suitable signal lines are provided for transmitting control signals and/or data between position-sensing unit 20 and processing unit 30. The signal lines serve in particular to transmit the position values generated in position-sensing unit 20 to processing unit 30.

In processing unit 30, the position values may be processed further, if necessary, to obtain output data. For this purpose, processing steps such as scaling, changing the data format, error correction, etc., may be required, which are performed purely digitally in processing unit 30. However, output data may not only be position values, but also velocity or acceleration values that are calculated in processing unit 30 from a plurality of successively generated position values.

Further provided in position-measuring device 10 is an interface unit 40 for communicating with subsequent electronics 100, on the one hand, and with measuring device components 20, 30, on the other hand. In particular, the output data is transmitted via interface unit 40 to subsequent electronics 100. The output data is transmitted to interface unit 40 via suitable signal lines from processing unit 30 or position-sensing unit 20. Interface unit 40 also receives a clock signal which serves as a time base for its internal processes. This clock signal may be the clock signal CLK.

The physical connection for transmitting instructions and data between interface unit 40 of position-measuring device 10 and a corresponding interface unit 140 of subsequent electronics 100 is provided by bidirectional data channel 50. To this end, data channel 50 is associated with a transmitter/receiver unit 60 in position-measuring device 10 and with a corresponding transmitter/receiver unit 160 in subsequent electronics 100, the transmitter/receiver units in turn being interconnected by an interface cable 61. In the present exemplary embodiment, transmitter/receiver units 60, 160 are suitably adapted to convert the respective instructions and/or data to be transmitted, which are typically in the form of single-ended signals, into differential signals according, for example, to the commonly used RS-485 standard, and to generate single-ended signals from the arriving differential signals. A line pair 55 is provided in interface cable 61 for signal transmission between transmitter/receiver units 60, 160. The two lines of line pair 55 are usually twisted together, so that interference effects, such as electromagnetic interference fields, interfere with the signals of both lines to the same extent. Since only the difference between the signals is decisive for the analysis, this way of routing signals is highly noise-immune. Line terminations 65, 165 are provided at the inputs of the respective transmitter/receiver units 60, 160 to prevent signal reflections.

In this exemplary embodiment, data channel 50 is configured as a bidirectional data channel. The data direction of transmitter/receiver units 60, 160 is controllable by the interface units 40, 140 associated therewith via a switchover signal 42, 142. Alternatively, data channel 50 could also be configured as a unidirectional data channel. In this case, two line pairs would have to be provided in interface cable 61 for bidirectional signal transmission.

The manner in which communication is performed between subsequent electronics 100 and position-measuring device 10 is defined in an interface protocol. Often, a so-called request/response scheme is employed; i.e., during a communication cycle, subsequent electronics 100 (master) sends an instruction, possibly followed by data, to position-measuring device 10 (slave), which processes the instruction and may transmit requested data to subsequent electronics 100. Instructions may generally be write and/or read commands, for example, to write to or read from memory cells in processing unit 30. A special position request command may be provided for requesting a position value as an output datum to subsequent electronics 100.

Like all operations in subsequent electronics 100, accesses to position-measuring device 10 are also controlled by an internal control unit 110. If subsequent electronics 100 is a numerical control system or any other controller used in automation technology, then control unit 110 may, for example, continuously request position values from position-measuring device 10 via interface unit 140 in order to obtain actual position values (actual location values) needed for control circuits in order, for example, to precisely position mechanical components of a machine by means of a drive (servo drive).

Subsequent electronics 100 also includes a clock generator 120 which generates a clock signal ACLK that is fed to control unit 110 and interface unit 140 for generating a time base; i.e., a time pattern.

Instructions and data are transmitted by interface units 40, 140 in the form of data frames structured according to the definitions of the data transmission protocol. Typically, data frames are initiated by a start sequence (preamble) and terminated by an end sequence (postamble). The data and/or instructions that are actually to be transmitted are located therebetween.

In accordance with the present invention, the data frames are not transmitted in unencoded form (i.e., a form where the value of each bit is transmitted by means of its associated signal level for a defined signal duration), but in encoded form. To this end, encoding rules are applied by the transmitter to the data frame to be transmitted before it is transmitted in the form of a data stream over data channel 50. Analogously, decoding rules are applied to the arriving data stream at the receiver end to restore the original data frame.

The encoding is such that the data stream includes at least two symbols which are distinguishable by the time interval between two successive signal edges. This applies, for example, to different variants of Manchester encoding.

Figure 2:
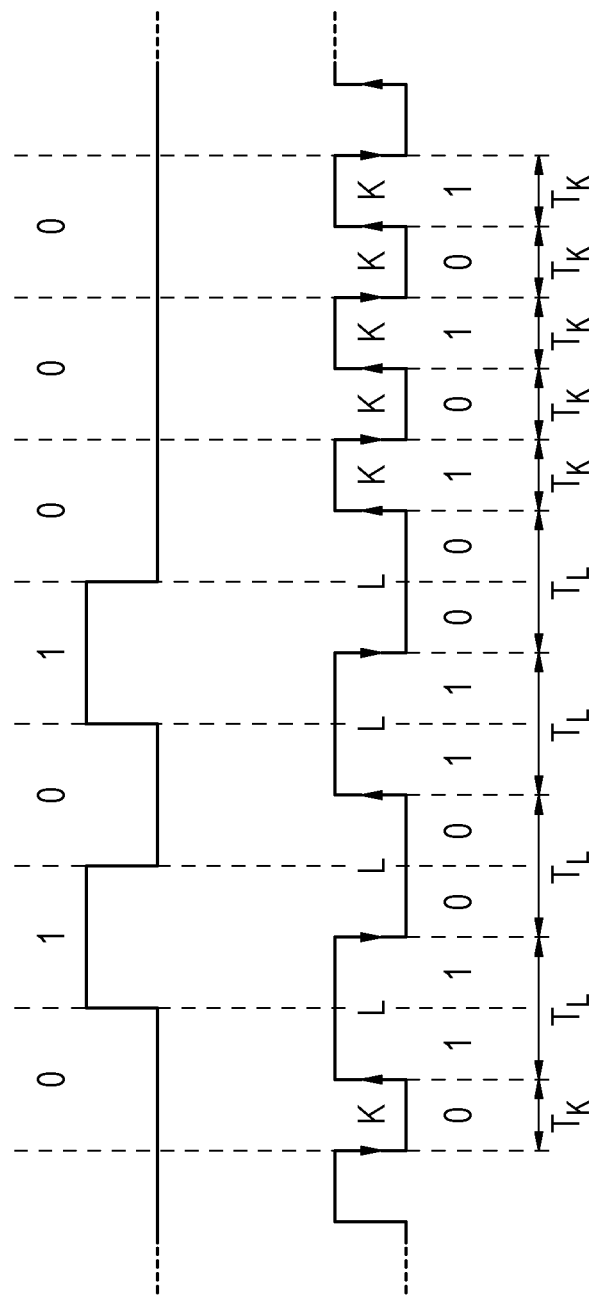
FIG. 2 is a signal diagram illustrating a Manchester encoding scheme.

FIG. 2, for example, shows a Manchester encoding scheme where a logic "0" is replaced by a rising signal edge (a "01" bit sequence and a logic "1" is replaced by a falling signal edge (a "10" bit sequence). In this way, the bit sequence "0101000" to be transmitted, shown at the top in FIG. 2, becomes the encoded bit sequence "01100110010101." This has the advantage, firstly, that the change in signal level necessarily occurring for each bit to be transmitted enables checking of the data transmission and, secondly, the encoded bit sequence has no DC component, which makes it possible to transmit the encoded bit sequence and a supply voltage over the same line pair 55 using modulation methods.

Using the illustrated encoding scheme (and provided that the original bit sequence is preceded and followed by a logic low level), a sequence of short symbols K having an ideal symbol duration $T_K$ and long symbols L having an ideal symbol duration $T_L$, in this example a sequence "KLLLLK-KKKK", is obtained for the encoded data stream.

Apart from the illustrated variant of Manchester encoding, the association between the signal edges and the logic levels may, of course, also be reversed. Differential Manchester encoding is also suitable.

Figure 3:
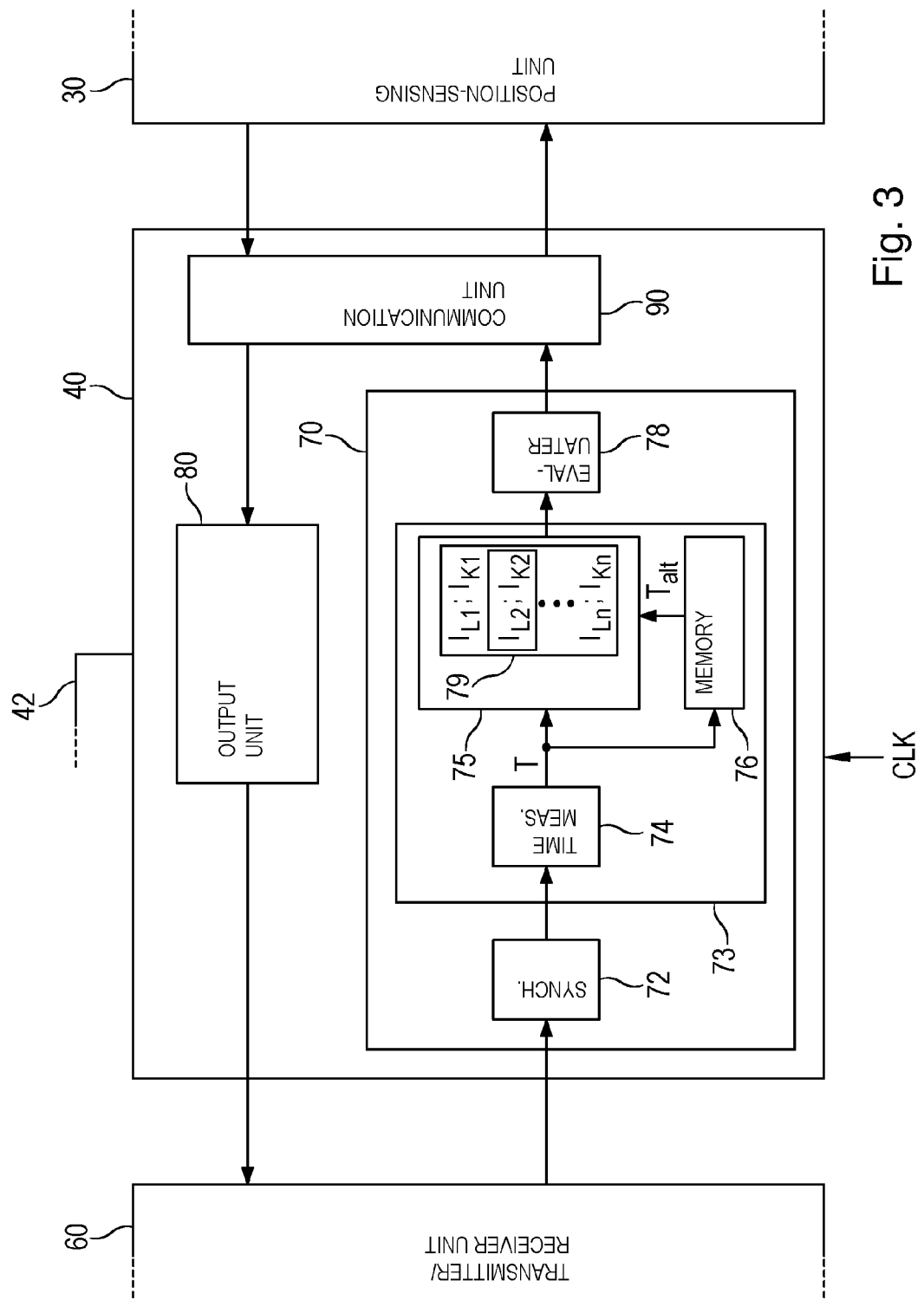
FIG. 3 is a block diagram of an interface unit of the position-measuring device.

FIG. 3 shows a block diagram of an interface unit 40. Interface unit 40 includes a read unit 70, an output unit 80, as well as a communication unit 90.

Read unit 70 serves to read and process arriving data streams and includes a synchronization unit 72, a symbol recognition unit 73, and an evaluation unit 78.

Synchronization unit 72 is connected upstream of symbol recognition unit 73. Synchronization unit 72 synchronizes the arriving data stream with clock signal CLK and outputs the synchronized data stream, which now has the time pattern of clock signal CLK, to symbol recognition unit 73. To this end, synchronization unit 72 may include, for example, one or more D-type flip-flops whose clock input is driven by clock signal CLK.

Symbol recognition unit 73 determines the symbol sequence from the synchronous data stream and outputs information to evaluation unit 78 regarding the sequence in which symbols K, L arrive in the data stream. Evaluation unit 78, in turn, evaluates and decodes the symbol sequence and outputs the contained payload data to communication unit 90.

The contents of the data frames transmitted with the arriving data stream are not altered by these processing steps.

Communication unit 90 relays commands, and, possibly, data contained in the received data frames, to the respective addressed target component(s) (e.g., position-sensing unit 20, processing unit 30, . . . ). Moreover, communication unit 90 receives data to be transmitted, for example, from position-sensing unit 20 or processing unit 30, and in turn creates a data frame therefrom, and outputs it to an output unit 80 of interface unit 40. In this data direction, processing unit 30 and/or position-sensing unit 20 function as source components for the data transmission.

Output unit 80 is suitably adapted to extend the data frame, if necessary, encode it and output it over data channel 50. The functions of output unit 80 are not part of the present invention and, therefore, are not described in greater detail herein.

In this exemplary embodiment, the determination of the symbol sequence in symbol recognition unit 73 is based on two essential steps: firstly, measuring the time interval between two successive signal edges (hereinafter referred to as "current symbol duration T") using a time measurement unit 74 and, secondly, associating a symbol K, L by comparing the current symbol duration T to decision intervals associated with symbols K, L in an association unit 75.

Time measurement unit 74 may be implemented, for example, by a counter device whose count input (clock input) receives clock signal CLK and which is interconnected in such a manner that each signal edge of the synchronized data stream causes the counter value of the counter device to be initially output to association unit 75 and, possibly, to be stored in a measurement value memory 76, and subsequently causes the counter to be reset.

In association unit 75, each symbol K, L is associated with two, or more generally n, decision intervals $I_{L1}$, $I_{K1}$; $I_{L2}$, $I_{K2}$; . . . ; $I_{Ln}$, $I_{Kn}$. In this connection, it is important to the present invention that, for the comparison and the resulting association of symbol K, L, the decision intervals $I_{L1}$, $I_{K1}$, $I_{L2}$, $I_{K2}$; . . . ; $I_{Ln}$, $I_{Kn}$ be selected based on the measured time interval of the preceding measurement (hereinafter referred to as "old symbol duration $T_{alt}$"). To this end, provision is made for the measurement value stored in measurement value memory 76 to be fed to association unit 75 as an old symbol duration $T_{alt}$. Thus, for the association of a symbol K, L with the current symbol duration T, a period of time including the old symbol duration $T_{alt}$ is taken into account.

Since old symbol duration $T_{alt}$ also represents a symbol K, L, it is composed of a constant portion (the ideal symbol duration of the symbol K, L underlying the old symbol duration $T_{alt}$) and a variable portion (the deviation of old symbol duration $T_{alt}$ from the ideal symbol duration $T_K$, $T_L$ of the underlying symbol K, L).

To simplify the selection of decision intervals $I_{L1}$, $I_{K1}$; $I_{L2}$, $I_{K2}$; . . . ; $I_{Ln}$, $I_{Kn}$ in association unit 75, computation means may be provided for reducing old symbol duration $T_{alt}$ to its deviation $\Delta T_{alt}$ from an ideal symbol duration $T_K$, $T_L$. Thus, only a numerical value needs to be taken into account for the selection of decision intervals $I_{L1}$, $I_{K1}$; $I_{L2}$, $I_{K2}$; . . . ; $I_{Ln}$, $I_{Kn}$, independently of the preceding symbol. For example, if the symbol underlying the old symbol duration $T_{alt}$ was a short symbol K, then the deviation is calculated as $\Delta T_{alt} = T_{alt} - T_K$. If the symbol was a long symbol L, then it holds that: $\Delta T_{alt} = T_{alt} - T_L$. Deviation $\Delta T_{alt}$ can be used as a pointer to the decision intervals $I_{L1}$, $I_{K1}$; $I_{L2}$, $I_{K2}$; . . . ; $I_{Ln}$, $I_{Kn}$ to be selected. In FIG. 3, for example, decision intervals $I_{L2}$, $I_{K2}$ were selected.

In this procedure, deviation $\Delta T_{alt}$ can assume negative values. As a result, when implementing association unit 75 as part of interface unit 40 in a digital circuit (e.g., in an FPGA, ASIC or microcontroller), a higher level of complexity will be required than if only positive values were to be processed; i.e., if the algebraic sign could be ignored. To nevertheless become independent of the preceding symbol and be able to make the selection based only on a numerical value, a constant may be added to deviation $\Delta T_{alt}$ as an offset value, so that the numerical value is reliably shifted into the range of positive numbers.

However, it is easier to take the ideal symbol duration of either a short symbol $T_K$ or a long symbol $T_L$ as the offset value. In this case, it is only necessary to perform an arithmetic operation if the symbol underlying the old symbol duration $T_{alt}$ differs from the one that was selected as the offset value.

For example, if the ideal symbol duration of a short symbol $T_K$ is selected as the offset value, then nothing needs to be done if the symbol underlying the old symbol duration $T_{alt}$ is a short symbol K, since it already holds that: $\Delta T_{alt} = \Delta T_{alt} + T_K$. However, if the symbol underlying the old symbol duration $T_{alt}$ is a long symbol L, then this long symbol L can be reduced to a numerical value that is also equivalent to $\Delta T_{alt} + T_K$ by subtracting the ideal symbol duration of a short symbol $T_K$ (provided it holds that: $T_L = 2*T_K$, as is the case in the preceding example).

Corresponding procedures are also possible when there is a different ratio between the ideal symbol durations of the symbols. The computation means in association unit 75 in each case need to be configured accordingly.

All of the variants mentioned are based on the principle of associating a current symbol duration T with a symbol K, L based on the deviation $\Delta T_{alt}$ of the symbol duration $T_{alt}$ of the preceding symbol K, L from an ideal symbol duration $T_K$, $T_L$. Thus, the period of time that is taken into account always includes also the old symbol duration $T_{alt}$ in addition to the current symbol duration T.

The result of the above-described variants can be further improved if, in addition to the old symbol duration $T_{alt}$ of the preceding symbol, still further preceding symbol durations are taken into account in association unit 75. Thus, the period of time taken into account is extended to include additional preceding symbol durations.

To this end, measurement value memory 76 has to be sized such that a plurality of old symbol durations can be stored and delivered to association unit 75. Moreover, the computation means in association unit 75 have to be suitably configured to sum up the deviations of all of the to-be-included old symbol durations from the ideal symbol durations. Since the deviations of the actual symbol durations from the ideal symbol durations depend, inter alia, on the charge of the interface cable 61, the algebraic sign of the deviations has to be taken into account in the summing operation. In this context, the deviations of older symbol durations may be weighted less than those immediately preceding the current symbol duration.

Decision intervals $I_{L1}$, $I_{K1}$; $I_{L2}$, $I_{K2}$; . . . ; $I_{Ln}$, $I_{Kn}$ are storable in association unit 75 in a memory unit 79. Advantageously, decision intervals $I_{L1}$, $I_{K1}$; $I_{L2}$, $I_{K2}$; . . . ; $I_{Ln}$, $I_{Kn}$ may be stored in an installation-dependent manner during initial operation of memory unit 79. Alternatively, a plurality of sets of decision intervals $I_{L1}$, $I_{K1}$; $I_{L2}$, $I_{K2}$; . . . ; $I_{Ln}$, $I_{Kn}$ may be stored in memory unit 79 and be adapted to be selectable, for example, in an installation-dependent manner. Criteria for the selection of a set of decision intervals $I_{L1}$, $I_{K1}$; $I_{L2}$, $I_{K2}$; . . . ; $I_{Ln}$, $I_{Kn}$ may be, for example, the properties and length of interface cable 61 and/or the desired data transfer rate.

Furthermore, provision may be made for decision intervals $I_{L1}$, $I_{K1}$; $I_{L2}$, $I_{K2}$; . . . ; $I_{Ln}$, $I_{Kn}$ to be dynamically variable, and for the thresholds to be determined for each particular application, for example, during initial operation or during the ramp-up phase upon power-up, and stored in memory unit 79.

Figure 4:
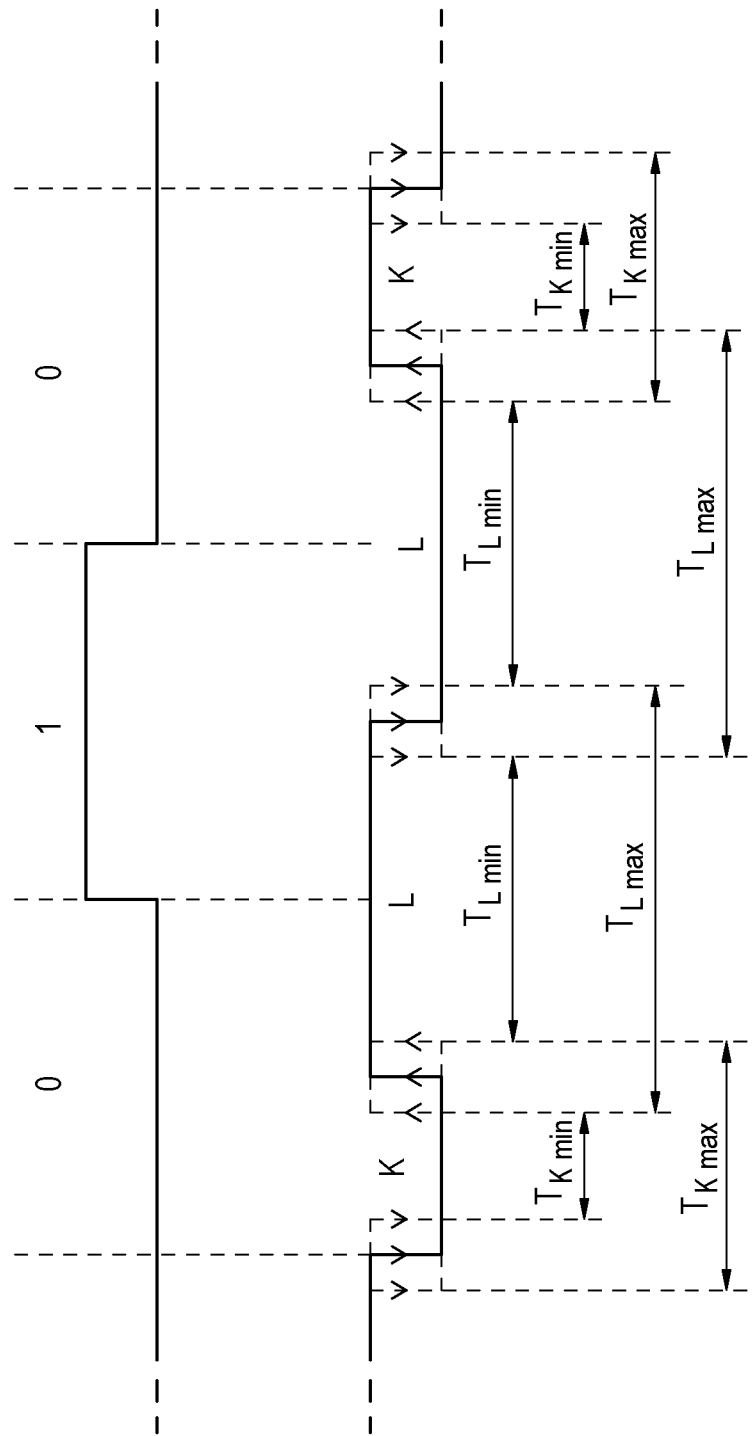
FIG. 4 is a view showing a portion of a Manchester-encoded data stream.

To further illustrate the problem, FIG. 4 shows portion of a Manchester-encoded data stream. The underlying, unencoded bit sequence "010" is shown in the upper portion of FIG. 4. Assuming that a logic "0" is also transmitted before and after this bit sequence, the Manchester-encoded symbol sequence "KLLK" is obtained. As a result of the transmission of this symbol sequence over data channel 50, the duration of symbols L, K at the receiver end is not always constant, but varies over a period of time. One of the reasons for this is the interface cable 61 over which the data stream is transmitted. The interface cable has both capacitive and inductive properties, so that change and discharge processes, as well as transient processes, occur in response to each change in signal level (bit change). Such processes flatten the signal edges, on the other hand, and cause overshoots and undershoots of the data signal, on the other hand.

This results in the illustrated variation in the position of the signal edges, also called "jitter", after the symbol sequence is recovered in transmitter/receiver unit 60. This effect ultimately results in that the time interval between the signal edges of a short symbol K, as measured in time measurement unit 74, may lie in a range between a minimum value $T_{Kmin}$ and a maximum value $T_{Kmax}$ and that of a long symbol L may lie in a range between a minimum value $T_{Lmin}$ and a maximum value $T_{Lmax}$.

If the durations of the symbols are distorted to such an extent that the intervals overlap each other ($T_{Kmax} \geq T_{Lmin}$), then, using the analysis known in the prior art (simple comparison of the measured time interval between two successive signal edges with exactly one decision interval per symbol), reliable association of the symbols is no longer ensured, and thus, the data transmission system is no longer functional.

The present invention takes into consideration that, while the position of the edges changes due to the transmission of the data stream over data channel 50, the overall data transfer rate remains constant. This leads to the realization that the old symbol duration $T_{alt}$ influences the current symbol duration T. This effect can be used to provide at least two decision intervals $I_{L1}$, $I_{K1}$; $I_{L2}$, $I_{K2}$ for each symbol K, L, and to select, for the association of symbols K, L in association unit 75 and depending on the old symbol duration $T_{alt}$ (the time interval between the signal edges of the preceding measurement), those decision intervals $I_{L1}$, $I_{K1}$; $I_{L2}$, $I_{K2}$ whose thresholds and/or value ranges are more likely to apply based on the requirement of maintaining the data transfer rate.

Here is an example:

If the preceding symbol was a short symbol K and the old symbol duration $T_{alt}$ was between $T_{Kmin}$ and $T_K$ (the ideal symbol duration for short symbols shown in FIG. 2), then a first decision interval $I_{K1}$ for short symbols K and a first decision interval IL1 for long symbols L are used for the association of a current symbol duration T in association unit 75. However, if the old symbol duration Talt was between $T_K$ and $T_{Kmax}$, then second decision intervals $I_{L2}$, $I_{K2}$ are used for the association of the current symbol duration T.

An analogous procedure applies if the preceding symbol was a long symbol L. If the old symbol duration $T_{alt}$ was between $T_{Lmin}$ and $T_L$, then decision intervals $I_{L1}$, $I_{K1}$ are used in association unit 75. If the old symbol duration $T_{alt}$ was between $T_L$ and $T_{Lmax}$, then decision intervals $I_{L2}$, $I_{K2}$ are used.

Based on the fact that the overall data transfer rate must remain constant, decision intervals $I_{L1}$, $I_{K1}$ have higher thresholds than decision intervals $I_{L2}$, $I_{K2}$.

Figure 5:
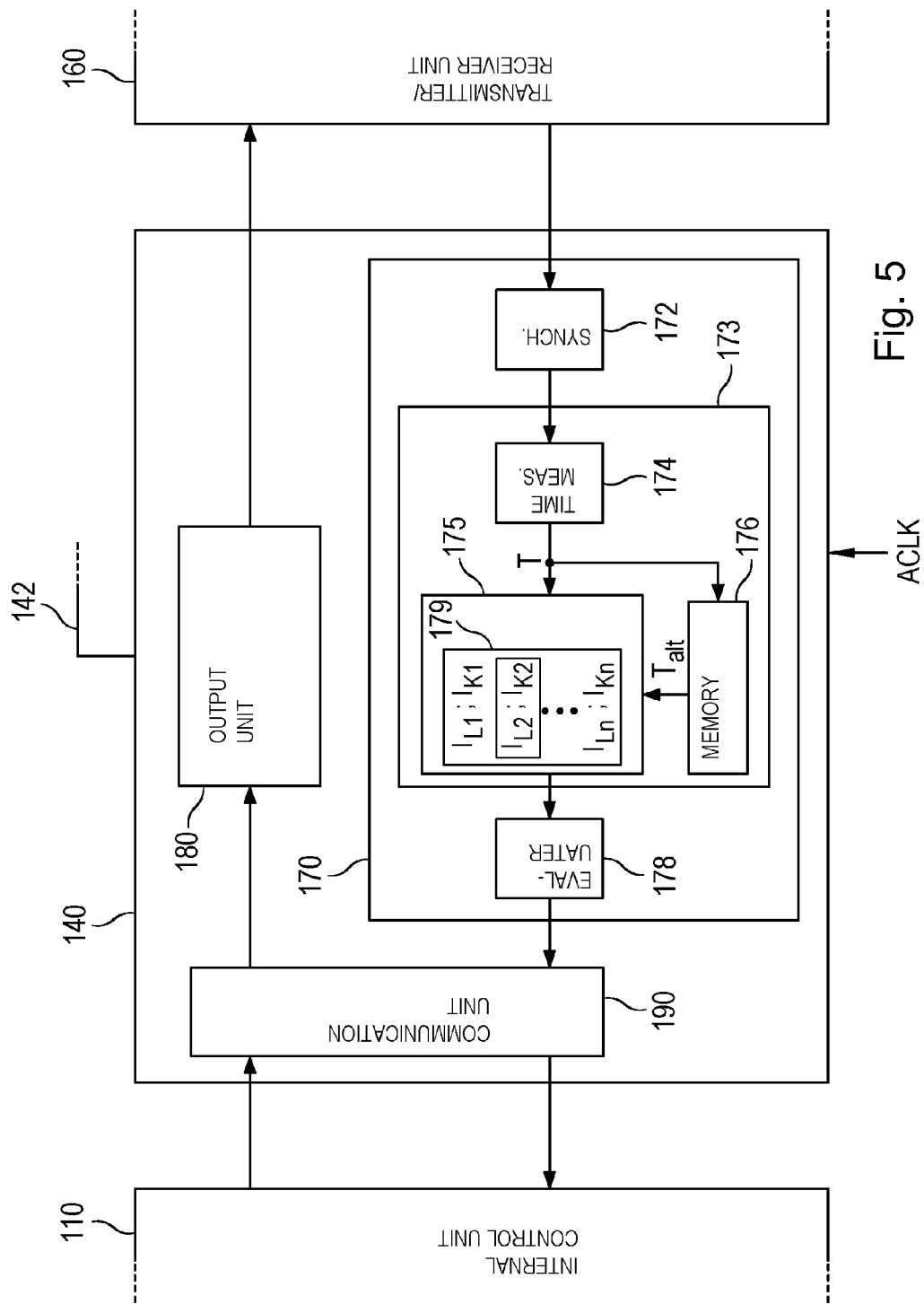
FIG. 5 is a block diagram of an interface unit of the subsequent electronics corresponding to the interface unit shown in FIG. 3.

FIG. 5 shows a block diagram of an interface unit 140 of subsequent electronics 100 as a counterpart of the corresponding interface unit 40 of position-measuring device 10 shown in FIG. 3.

Interface units 40, 140 are configured symmetrically with respect to one another, so that each unit of interface unit 40 finds its counterpart in interface unit 140. For example, interface unit 140 also has a read unit 170 having a synchronization unit 172, a symbol recognition unit 173 including a time measurement unit 174, an association unit 175 having a memory unit 179, and further including a measurement value memory 176, as well as an evaluation unit 178. Also present are an output unit 180 and a communication unit 90.

Figure 6:
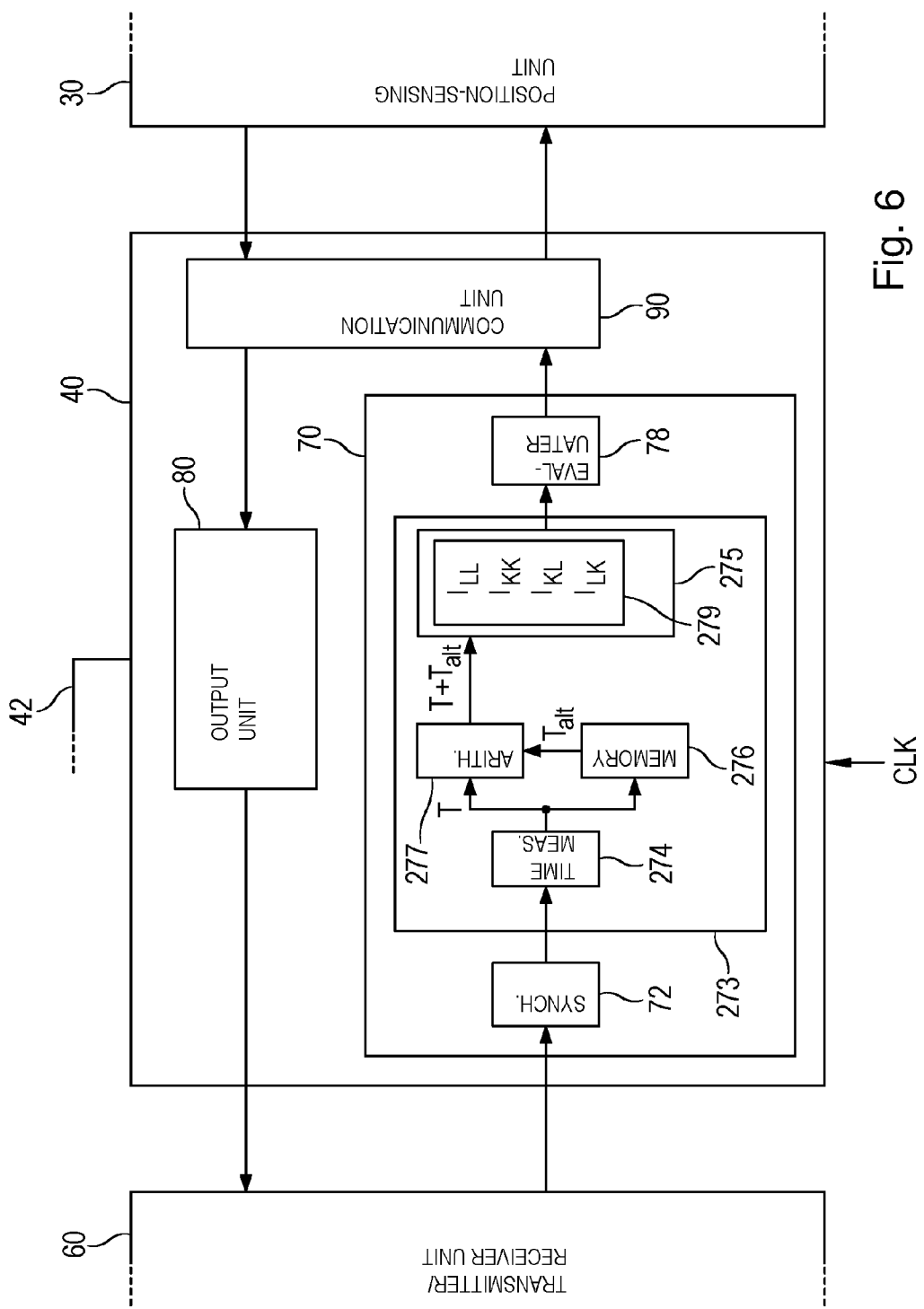
FIG. 6 is a block diagram of an alternative embodiment of an interface unit of the position-measuring device.

FIG. 6 shows a block diagram of an interface unit 40 having an alternatively configured symbol recognition unit 273. This embodiment is based on the realization that, especially in the case of encoding schemes which, such as Manchester encoding, are characterized by a substantially DC-free data transmission, the deviations of successive symbols behave oppositely. This is due, inter alia, to charge-reversal processes in interface cable 61. Thus, if the current symbol duration T of a measurement is longer than the ideal symbol duration $T_K$, $T_L$ of the underlying symbol K, L, then the measurement value T of the following measurement is shorter than the ideal symbol duration $T_K$, $T_L$ of the underlying symbol K, L, and vice versa. As already mentioned in the description of FIG. 4, this holds true because the data transfer rate is not altered by the transmission.

Symbol recognition unit 273 has a time measurement unit 74 capable of measuring the time interval between two successive signal edges. Measurement value T is delivered to a measurement value memory 276 and an arithmetic unit 277. Arithmetic unit 277 is suitably adapted to calculate the sum of the current measurement value T and the old measurement value $T_{alt}$, which is fed thereto from measurement value memory 276, and to output this sum to association unit 275. In association unit 275, memory unit 279 now contains a number of decision intervals no greater than the maximum number of possible symbol sequences. In the present example, there are four decision intervals $I_{LL}$, $I_{KK}$, $I_{KL}$, $I_{LK}$. Since the value ranges of decision intervals $I_{KL}$, $I_{LK}$ are identical, it is possible to reduce the number of decision intervals to three, for example, to decision intervals $I_{LL}$, $I_{KK}$, $I_{KL}$. The symbol L, K associated with the current symbol duration T can now be determined simply by comparing the sum of current symbol duration T and old symbol duration $T_{alt}$ to decision intervals $I_{LL}$, $I_{KK}$, $I_{KL}$. If the comparison result lies within decision interval $I_{KL}$, then the last-associated symbol determines the association of the current symbol K, L.

The basic idea of the present invention of taking into account, for the association of a symbol K, L, a period of time that includes also the old symbol duration $T_{alt}$ is also preserved in this embodiment. The ideal symbol duration $T_K$, $T_L$ underlying the old symbol duration $T_{alt}$ again represents an offset value. As already mentioned in the description of FIG. 3, the component of the ideal symbol duration $T_K$, $T_L$ can be eliminated by subtraction or reduced to a single offset value for the association of symbol K, L. In this case, only two decision intervals need to be provided in association unit 275.

Figure 7:
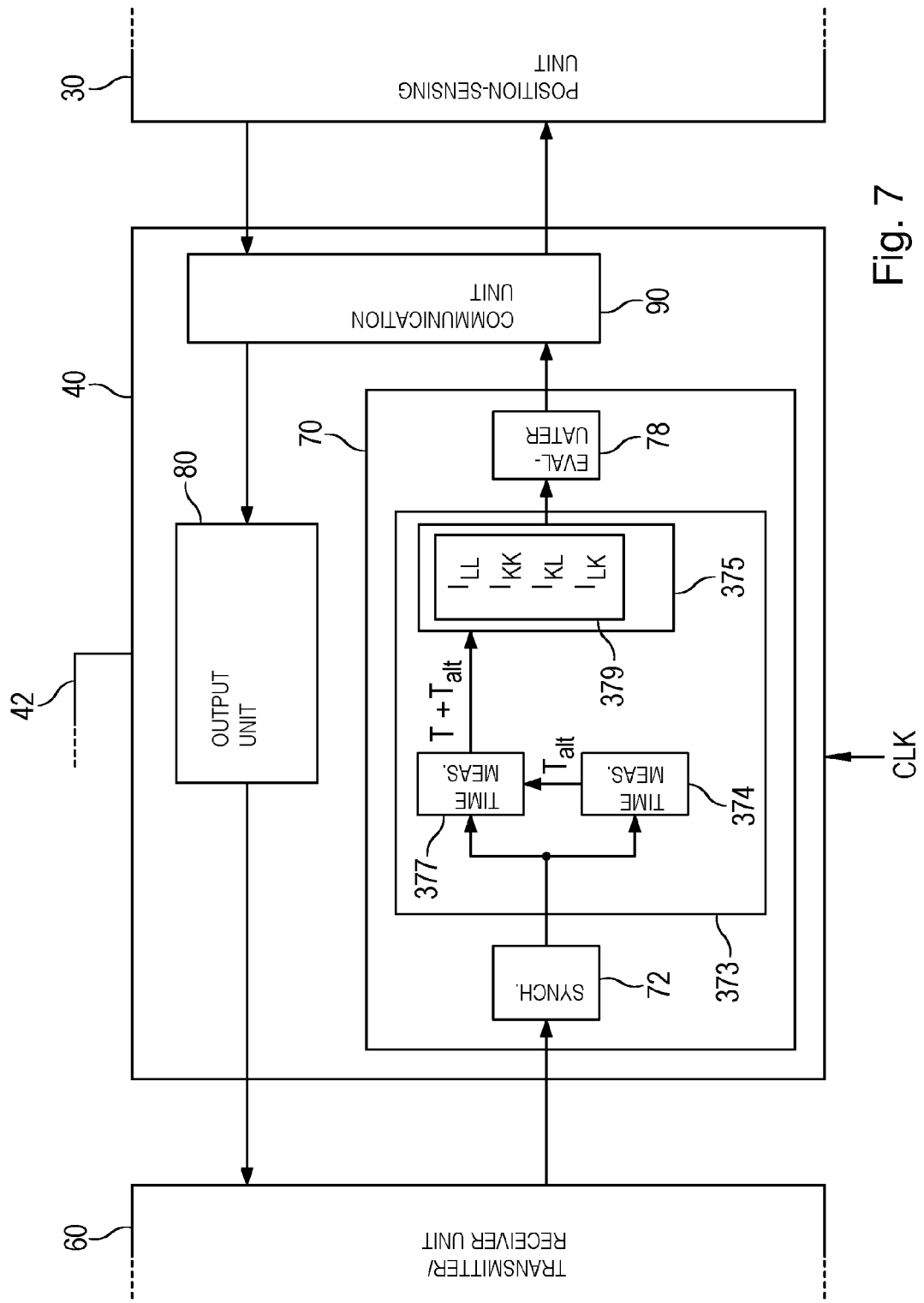
FIG. 7 is a block diagram of a further alternative embodiment of an interface unit of the position-measuring device.

FIG. 7 shows a block diagram of an interface unit 40 having another, alternatively configured symbol recognition unit 373. The function of symbol recognition unit 373 of this variant corresponds to that of symbol recognition unit 273 of FIG. 6, except that the summation is performed in a different way.

In addition to time measurement unit 374, whose function corresponds to that of the previously described time measurement units 74, 174, 274, symbol recognition unit 373 has a second time measurement unit 377, which is loadable with measurement value T of time measurement unit 374. Thus, an offset is applied to the time measurement of second time measurement unit 377, as a result of which, again, the result of the time measurement includes a period of time that corresponds to the sum of old symbol duration $T_{alt}$ and current symbol duration T. This sum is fed to association unit 375, which includes memory unit 379 containing decision intervals $I_{LL}$, $I_{KK}$, $I_{KL}$, $I_{LK}$, whose function in each case corresponds to that of the corresponding units of FIG. 6.

In the exemplary embodiments described with reference to FIGS. 6 and 7, it also applies that the period of time taken into account may be extend to include additional preceding symbol durations.

Figure 8:
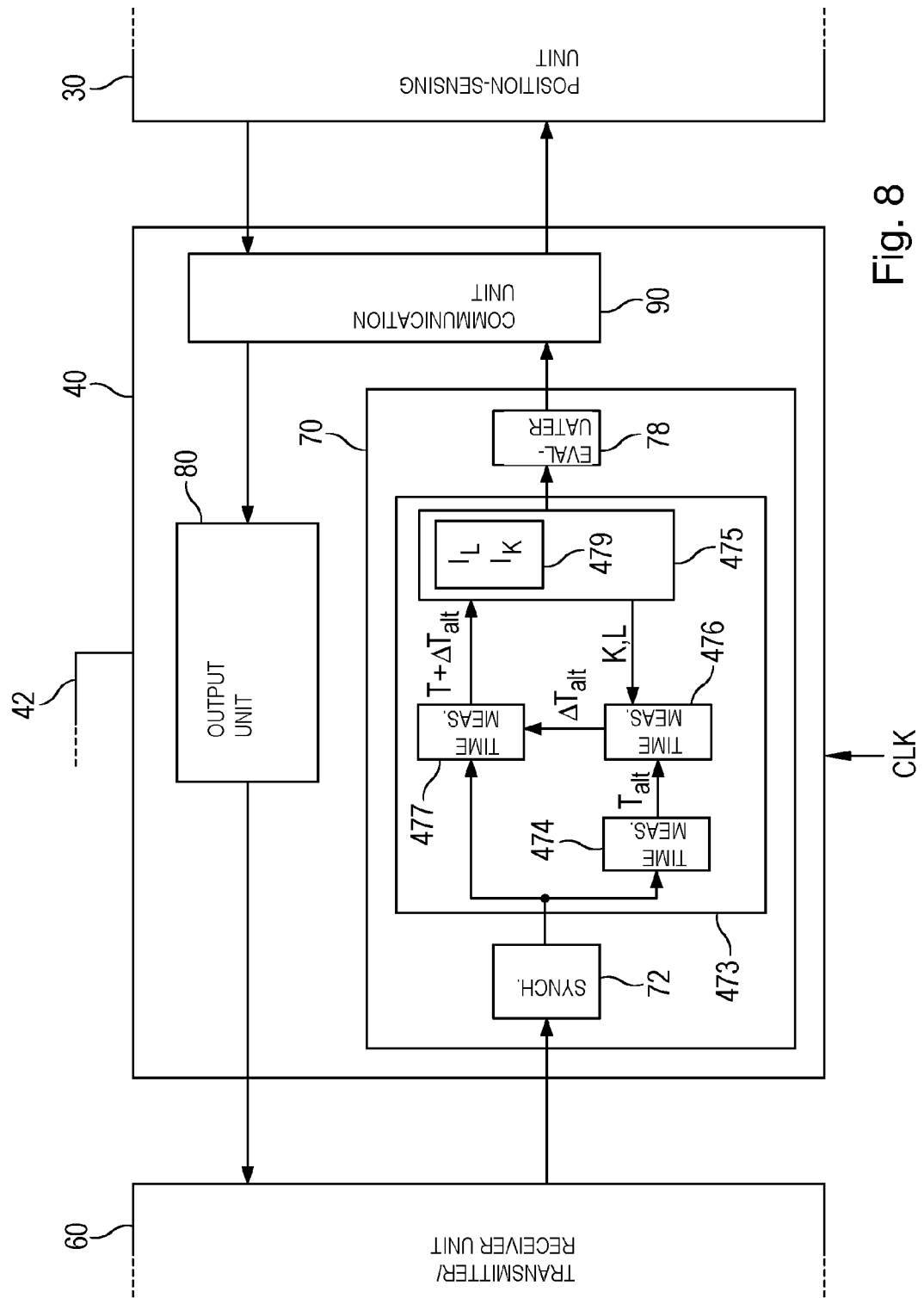
FIG. 8 is a block diagram of a further alternative embodiment of an interface unit of the position-measuring device.

FIG. 8 shows block diagram of a further embodiment of a symbol recognition unit 473.

As in the preceding exemplary embodiment, symbol recognition unit 473 includes a time measurement unit 474, a second time measurement unit 477 and an association unit 475 having a memory unit 479.

In contrast to the preceding exemplary embodiment, there is further provided an arithmetic unit 476.

Arithmetic unit 476 serves to eliminate by subtraction the component of the ideal symbol duration $T_K$, $T_L$ from the old symbol duration $T_{alt}$ for the association of symbol K, L in association unit 475. To this end, information about the last-associated symbol K, L is fed thereto from the association unit. The determined deviation $\Delta T_{alt}$ is fed to second time measurement unit 477 and used as an offset for the time measurement. The result of the time measurement $T+\Delta T_{alt}$ is fed to association unit 475.

Alternatively, however, the component of the ideal symbol duration $T_K$, $T_L$ in the old symbol duration $T_{alt}$ may also be reduced in arithmetic unit 476 to a single offset value which, as a constant, corresponds to either the symbol duration of an ideal long symbol $T_L$ or the symbol duration of an ideal short symbol $T_K$. This offset can be easily taken into account in association unit 475. In any case, only two decision intervals $I_L$, $I_K$ need to be provided in association unit 275.

In this exemplary embodiment, too, the period of time to be taken into account may be extended to include additional preceding symbol durations.

Figure 9:
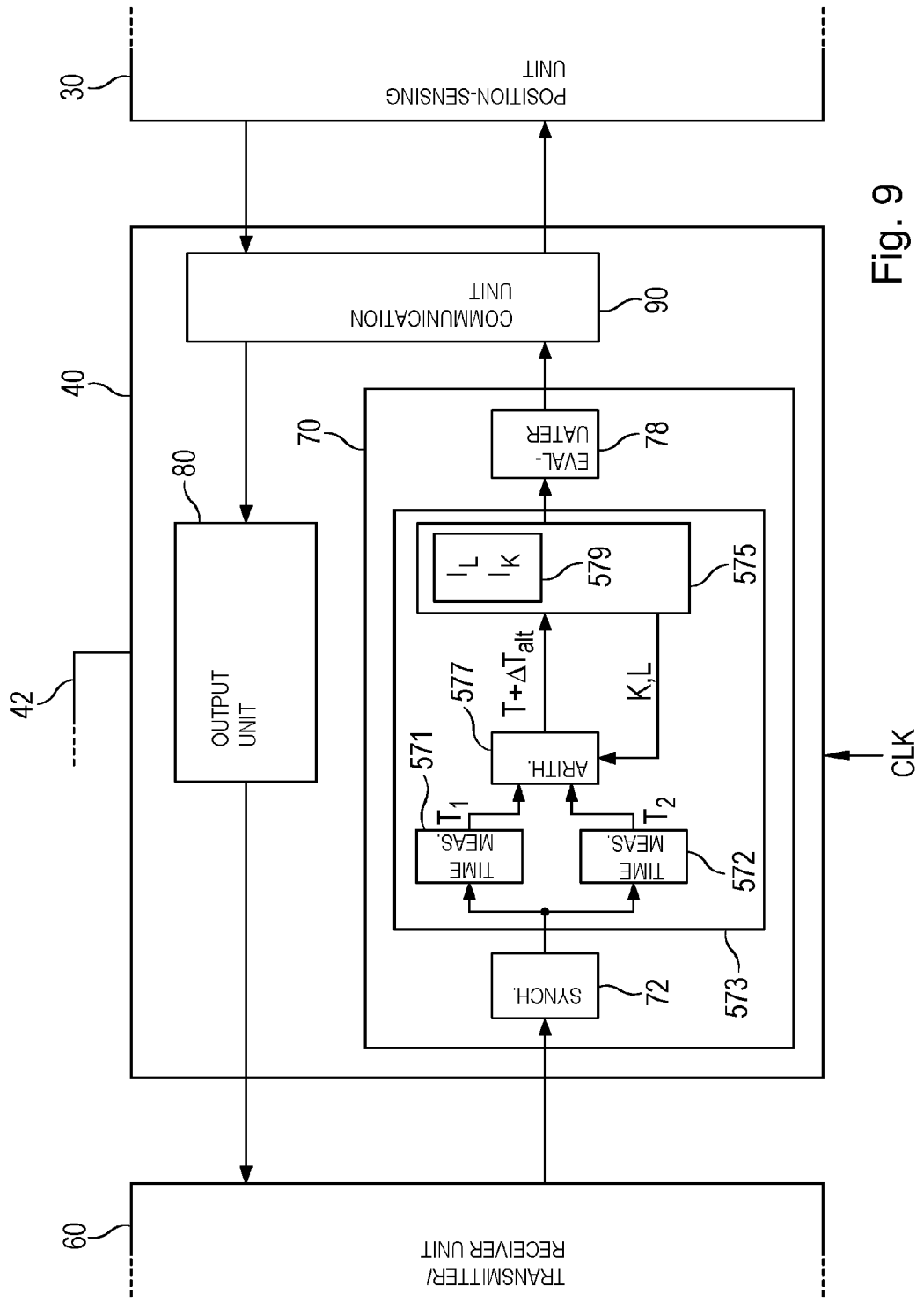
FIG. 9 is a block diagram of another alternative embodiment of an interface unit of the position-measuring device.

FIG. 9 shows block diagram of a further embodiment of a symbol recognition unit 573.

Symbol recognition unit 573 includes a first time measurement unit 571, a second time measurement unit 572, an arithmetic unit 577, as well as an association unit 575 having a memory unit 579. Association unit 575 and memory unit 579 are identical to the corresponding units of the preceding exemplary embodiment.

First time measurement unit 571 and second time measurement unit 572 are configured to measure a period of time which already includes two symbol durations (i.e., a current symbol duration T and an old symbol duration $T_{alt}$). In a specific example, first time measurement unit 571 may be configured to measure a first duration T1 from one rising signal edge to the next rising signal edge of the data stream, while second time measurement unit 572 is configured to measure a second duration T2 from one falling signal edge to the next falling signal edge of the data stream.

Durations T1, T2 are both fed to arithmetic unit 577. They each correspond to a respective sum of a current symbol duration T and an old symbol duration $T_{alt}$, as already described in preceding exemplary embodiments, and are alternately evaluated. Consequently, the component of the ideal symbol duration $T_K$, $T_L$ in the old symbol duration $T_{alt}$ may be eliminated by subtraction or reduced to a single offset value in arithmetic unit 577, as in the preceding exemplary embodiment. The result, again, is the sum of the current measurement value T and the deviation $\Delta T_{alt}$ (possibly including an offset), which is fed to association unit 575.

Alternatively, the evaluation may be performed analogously to the exemplary embodiments described with reference to FIGS. 6 and 7 by feeding durations T1, T2 alternately to an association unit 275, 375.

In this exemplary embodiment, too, the period of time to be taken into account may be extended to include additional preceding symbol durations by providing additional time measurement units and extending the measurement range of the time measurement units to a greater number of signal edges, and provided the arithmetic unit is adapted accordingly.

The interface units of the exemplary embodiments described with reference to FIGS. 5 through 9 can also be used in the subsequent electronics.

Based on the idea of taking into account, for the association of symbols, a period of time that includes a symbol duration of a symbol that is currently to be associated and at least a symbol duration of the preceding symbol, other, alternative embodiments can, of course, also be realized within the scope of the present invention.

In addition to position-measuring devices 10 and subsequent electronics 100 thereof, the present invention is also suitable for other automation technology equipment.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for reading a serial data stream in a piece of automation technology equipment, the method comprising:
    encoding the data stream to include at least two symbols which are each distinguishable by a time interval between two successive signal edges;
    measuring the time interval for a current symbol to be currently associated as a current symbol duration, and at least one old symbol duration of a preceding one of the symbols;
    associating a time sequence of the signal edges with a respective one of the symbols based on a period of time including the current symbol duration and the at least one old symbol duration.

2. The method as recited in claim 1, further comprising synchronizing the data stream with a clock signal, and using the synchronized data stream for the associating the time sequence of the signal edges.

3. The method as recited in claim 1, further comprising outputting information about a sequence of the symbols for further evaluation.

4. The method as recited in claim 1, wherein the associating the time sequence of the signal includes receiving at least one of the following values:

the current symbol duration and the at least one old symbol duration;

a sum of the current symbol duration and the at least one old symbol duration;

a sum of the current symbol duration and a deviation of the at least one old symbol duration from an ideal duration; or a sum of the current symbol duration, the deviation of the at least one old symbol duration from the ideal duration and an offset value, wherein the current symbol duration is associated with a respective one of the symbols based on the received values.

5. The method as recited in claim 4, wherein the association is performed by comparison with decision intervals.

6. The method as recited in claim 1, wherein the encoding is performed using an encoding scheme which is a Manchester encoding scheme in which the data stream contains a sequence of short symbols and long symbols.

7. The method as recited in claim 1, further comprising using decision intervals which are installation-dependent and are stored in memory.

8. A device for reading a serial data stream in a piece of automation technology equipment, the device comprising:

a reader configured to receive a data stream that is encoded to include at least two symbols which are distinguishable by a time interval between two successive signal edges, the reader including a time measurer configured to measure the time interval for a current symbol to be currently associated as a current symbol duration, and at least one old symbol duration of a preceding one of a preceding one of the symbols, the reader including a symbol recognizer configured to associate a time sequence of the signal edges with a respective one of the symbols based on a period of time including the current symbol duration and the at least one old symbol duration.

9. The device as recited in claim 8, further comprising a synchronizer connected upstream of the symbol recognizer and configured to synchronize the data stream with a clock signal and to deliver the synchronized data stream to the symbol recognizer.

10. The device as recited in claim 8, wherein the symbol recognizer is configured to output the information about a sequence of the symbols to an evaluator for further evaluation.

11. The device as recited in claim 8, wherein the symbol recognizer includes an associater configured to receive at least one of the following values:

the current symbol duration and the at least one old symbol duration;

a sum of the current symbol duration and the at least one old symbol duration;

a sum of the current symbol duration and a deviation of the at least one old symbol duration from an ideal duration; or a sum of the current symbol duration, the deviation of the at least one old symbol duration from the ideal duration and an offset value, wherein the associater is configured to associate the current symbol duration with a respective one of the symbols based on the received values.

12. The device as recited in claim 11, wherein the associater is configured to perform the association by comparison.

13. The device as recited in one of claim 11, wherein the symbol recognizer is configured to generate the values.

14. The device as recited in claim 8, wherein the data stream is encoded with an encoding scheme that is a Manchester encoding scheme in which the data stream contains a sequence of short symbols and long symbols.

15. The device as recited in claim 8, further comprising a memory storing an installation-dependent decision interval.

* * * * *